United States Patent [19]

Maelzer

[11] Patent Number: 4,829,241
[45] Date of Patent: May 9, 1989

[54] APPARATUS FOR TESTING PRINTED CIRCUIT BOARDS

[76] Inventor: Martin Maelzer, Hagenburger Str. 26, D-3050 Wunstorf, Fed. Rep. of Germany

[21] Appl. No.: 121,111

[22] Filed: Nov. 16, 1987

[30] Foreign Application Priority Data

Nov. 18, 1986 [DE] Fed. Rep. of Germany ....... 3639361

[51] Int. Cl.$^4$ ............................................ G01R 31/02
[52] U.S. Cl. ............................ 324/158 F; 324/73 PC
[58] Field of Search ............ 324/158 F, 158 P, 73 PC

[56] References Cited

U.S. PATENT DOCUMENTS

| | | | |
|---|---|---|---|
| 4,230,985 | 10/1980 | Matrone et al. | 324/158 F |
| 4,288,745 | 9/1981 | Plante et al. | 324/158 F |
| 4,724,377 | 2/1988 | Maelzer et al. | 324/73 PC |
| 4,746,861 | 5/1988 | Nesbitt | 324/73 PC |

FOREIGN PATENT DOCUMENTS

| | | |
|---|---|---|
| 3240916 | 5/1984 | Fed. Rep. of Germany . |
| 3405567 | 8/1985 | Fed. Rep. of Germany . |
| 3405566 | 8/1985 | Fed. Rep. of Germany . |
| 3511821 | 6/1986 | Fed. Rep. of Germany . |
| 59-90065 | 11/1982 | Japan . |
| 2085673 | 4/1982 | United Kingdom . |

*Primary Examiner*—Ernest F. Karlsen
*Attorney, Agent, or Firm*—Fitzpatrick, Cella, Harper & Scinto

[57] ABSTRACT

An apparatus for testing printed circuit boards.

In an apparatus for testing test points of a printed circuit board arranged on and/or off grid by means of an adapter which, during the testing, is arranged between contact elements of an electronic testing apparatus and a printed circuit board at a testing position, having a table shaped receiving device for the printed circuit boards with a frame arranged above it for holding the adapter and the testing apparatus, and having a centering device for the printed circuit boards, the delivery of the printed circuit boards is improved while ensuring convenience of operation. This is achieved by providing a movable carrier plate for receiving the printed circuit boards on which the printed circuit board can be centered by means of a first centering device and which can be conveyed in or to a pre-positioned position by means of a conveyor having at least one movable conveying element from an insertion position to the testing position, and by providing a second centering device for the carrier plate near the testing position.

44 Claims, 3 Drawing Sheets

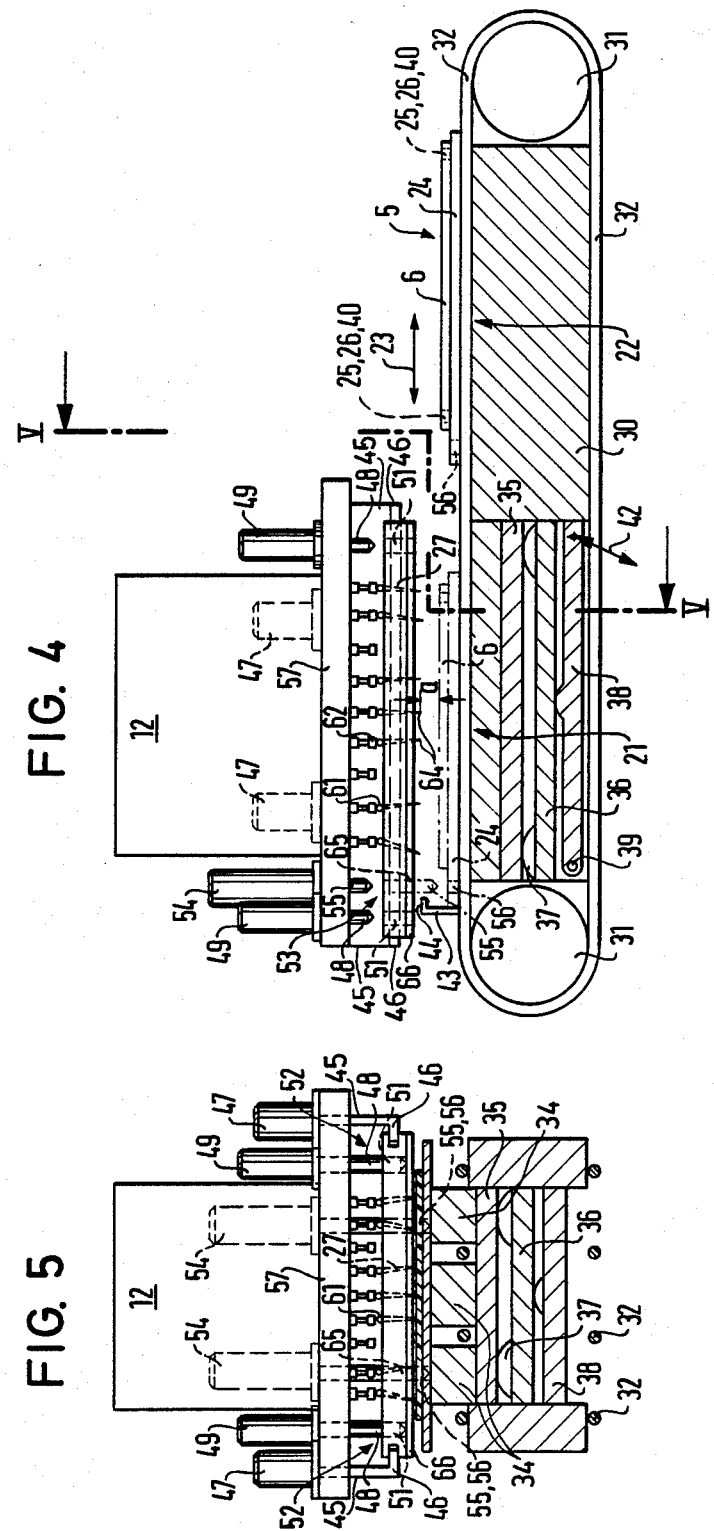

APPARATUS FOR TESTING PRINTED CIRCUIT BOARDS

BACKGROUND OF THE INVENTION

1. Technical Field of the Invention

The invention relates to an apparatus.

2. Description of the Prior Art

Printed circuit boards to be tested must be arranged in an exact and precisely reproducible position underneath the adapter for testing printed circuit boards and in particular it concerns novel arrangements for holding printed circuit boards during testing thereof in most cases has test pins, so that the contact points of the adapter, e.g. the tips of the test pins, exactly meet the associated contact points or test points in the printed circuit board.

An apparatus of the kind described above is the subject of an earlier proposal by the applicant. In this arrangement the printed circuit board is centred at the testing position between frame-shaped guide rails. It is therefore necessary to make the dimensions of the printed circuit boards to be tested reproducibly identical so that they can fit perfectly between the frame-shaped guide rails. The fitting (centering and positioning) of the printed circuit boards to be tested involves a considerable amount of work. The same applies to the exact dimensioning of the frame-shaped guide rails and of the printed circuit boards to be tested. If there is a difference in the fitting tolerances, a fit is not possible or contact difficulties occur as a result both of a non-fitting printed circuit board and of there being too much play.

It has already been suggested on the part of the applicant to place the printed circuit board to be tested at an insertion position away from the testing position and to convey it to the testing position by means of an inclined slide. In this arrangement there is the danger that the printed circuit board may be displaced whilst sliding, which can cause problems when the printed circuit board is received at the testing position.

An object of the invention is to improve the delivery of the printed circuit board in an apparatus of the kind described in the introduction while ensuring that it is simple and convenient to operate.

SUMMARY OF THE INVENTION

According to the invention there is provided in an apparatus for testing printed circuit boards, a movable carrier plate for receiving a printed circuit board to be tested. The first centering means is provided to center the printed circuit board on the carrier plate. The conveyor is provided to move the carrier plate from an insertion position to a testing position; and a second centering device is provided for centering the carrier plate near the testing position.

The arrangement according to the invention makes it possible to transfer the printed circuit board to be tested from the insertion position to the testing position, first by means of a controlled conveyance, if desired, at a predetermined speed, which can be pre-set by means of a suitable drive mechanism and second, in a predetermined position through the agency of the carrier plate, on to which the printed circuit board can be placed without any problems. Centering of the printed circuit board to be tested relative to the carrier plate is already ensured on inserting the printed circuit board at the insertion position, and centering relative to the test apparatus at the testing position is ensured by the second centering device. Within the scope of the invention the carrier plate can also be pre-positioned on its way to the testing position.

Other, more specific, aspects of the invention include features which lead to simple, space saving and useful constructions and/or drive mechanisms and conveyors by which economic production can be obtained with more reliable and accurate functioning.

BRIEF DESCRIPTION OF THE DRAWINGS

Exemplary embodiments of the invention will now be described in greater detail with reference to simplified drawings, in which:

FIG. 4 is a vertical longitudinal section through the apparatus in a schematic representation;

FIG. 5 is the partial section taken along line IV—IV in FIG. 4.

DETAILED DESCRIPTION OF PREFERRED EMBODIMENTS OF THE INVENTION

Figure 1:
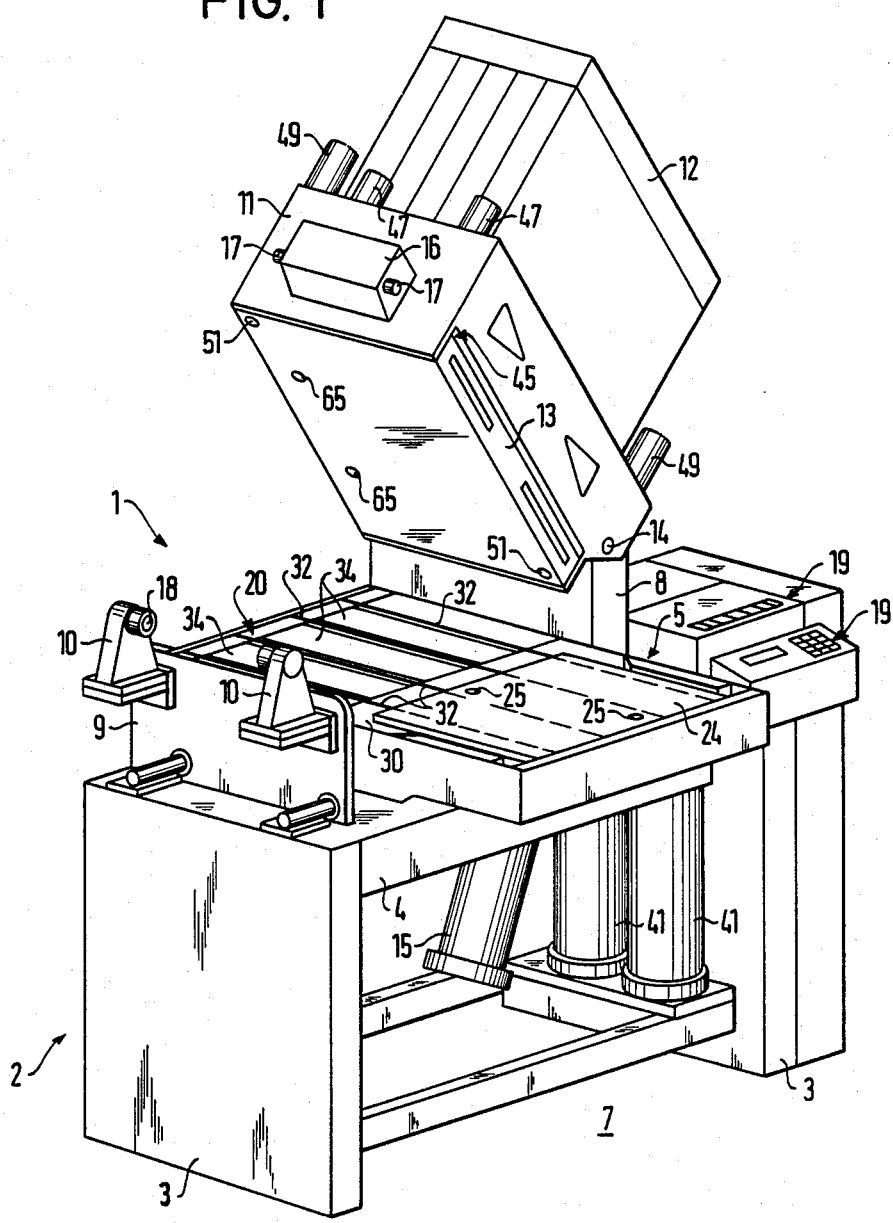
FIG. 1 is a perspective representation of an apparatus constructed according to the invention with a frame for holding an electronic testing device and an adapter in the open position.

The apparatus in FIG. 1, generally denoted by 1, has a stand 2 with two side legs 3 in the form of a table. Arranged on an upper cross-piece 4, there is a receiving device 5, also table shaped, for the printed circuit boards (represented in FIG. 2) to be tested which projects out from the operating side (represented at 7) of the apparatus 1. The receiving device 5, a bearing block 8 arranged on the right-hand side and a bearing wall 9 arranged on the left-hand side, with two bearing supports 10 which, viewed from the operating side 7, are arranged at the same height behind one another, form a structural part that is bolted to the stand 2 to form a single structural unit.

Figure 2:
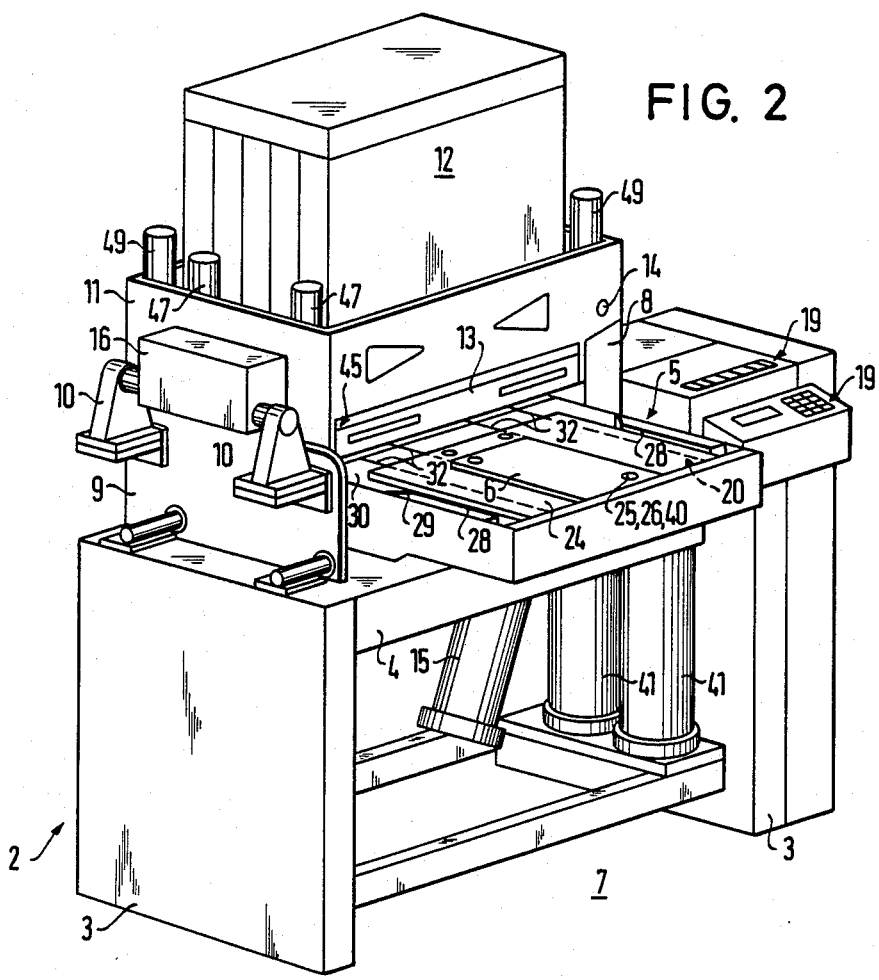
FIG. 2 shows the apparatus with the holding frame in the operative position.

A frame 11, which is provided for holding an electronic testing device 12 and an adapter 13, can be swivelled about an axis 14, arranged horizontally on the right-hand side, by means of a piston-cylinder unit 15 between the open position shown in FIG. 1 and an operational position shown in FIG. 2. In the operational position the holding frame 11 is both centered and secured by means of a piston-cylinder unit that is integrated in a block 16 and has two oppositely acting pistons 17 (shown in FIG. 1) which engage into corresponding centering sockets 18 in the bearing supports 10.

Operating keyboards and electric control devices are denoted by 19.

The receiving device 5 has a conveyor, generally denoted by 20, by which the printed circuit board 6 is movable back and forth from a testing position, generally denoted by 21 in FIG. 4, to an insertion position 22 opposite it and offset to the operating side 7. The directions of movement are shown by the double arrow 23. The printed circuit board 6 is moved on a carrier plate 24 that is longer and wider than the printed circuit board 6. The carrier plate 24 has centering pins 25 positioned substantially diagonally opposite one another and pointing upwards, which can be fixed to the carrier plate 24 by insertion, gluing or by integral construction, and which engage in correspondingly dimensioned centering holes 26 in the printed circuit board 6. The cross-section of the centering pins 25 and the centering holes 26 is preferably round. The centering pins 25 are preferably arranged in such a way that they are located within the surface area of the smallest printed circuit board so that both small and large printed circuit boards can be centred with one and the same centering pins 25 and holes 26. Placing the printed circuit board on the carrier plate does not present any problems, as it can be easily held or guided by its edges and the centering pins can also have sloping surfaces, e.g. in the form of a conical or truncated conical tip (not shown).

At the insertion position 22, the printed circuit board 6 and the carrier plate 24 are shown clearly in FIG. 4, whilst at the testing position 21 they are indicated by dash-dot lines. The arrangement is such that between the adapter 13, i.e. between its contact points, which in the present exemplary embodiment are formed by the tips of the testing pins 27, there is a distance a.

Alongside the carrier plate 24 are pre-positioning members or edges 28 (FIG. 2), preferably with run-in slopes 29 which can be rails that are fixed on to a plate 30 of the receiving device 5 and border the carrier plate 24 with lateral play.

The conveyor 20 is formed from endless conveyor belts 32 running around rollers 31 or rolls. In the present exemplary embodiment, four such belts are arranged spaced apart from one another and slide along the horizontal plate 30 of the receiving device 5. A drive for the conveyor 20, acting on at least one roller 31, is provided but is not shown for the sake of simplicity.

Inserted in the plate 33, near the testing position 21, there are three vertically displaceable pressure rails 34 (FIG. 1 and 5) which are arranged on a first pressure plate 35. Underneath the first pressure plate 35 there is a second pressure plate 36, and between the first and second pressure plates 35, 36 four pressure bellows 37, known per se, are arranged near the corners of the pressure plates 35, 36. Underneath the second pressure plate 36 there is a pressure member 38 which can be swivelled in the direction of the double arrow 42 about an axis 39 (FIG. 4) by means of a piston-cylinder unit 41, which is partially shown only in FIGS. 1 and 2.

On the side facing away from the insertion position 22 and associated with the testing position 21 are one or two spots 43 (FIG. 4) for the carrier plate 24, which can be fixed on to the plate 30 or the pressure rails 34. The stops 43 have hook-shaped projections 44 which clasp over the carrier plate 24. When the stops are fixed on the plate 30 there must be a vertical space between the stops 44 and the carrier plate 24 which corresponds to at least the vertical displacement of the carrier plate 24.

The adapter 13 is contained in an adapter guide 45, which is shaped like a drawer and into which the adapter 13 can be pushed from the operating side 7. The guide rails 46 of the guide 45, indicated in FIGS. 4 and 5, are all vertically displaceable by four piston-cylinder units 47, arranged at the sides, from a lower displaced position to a higher, centred and secured, operating position. The displacement is about 10 mm. Centering of the adapter 13 is effected by means of two diagonally opposite cylindrical, conically pointed centering pins 48, which extend vertically and are each displaceable by a piston-cylinder unit 49 between a raised release position and a centering position in which they are pushed down into a correspondingly shaped centering hole 51 in the adapter 13. In FIG. 4 the centering pins 48 are shown in their release position whereas in FIG. 5 they are in the centering position, pushed into the adapter 13. This centering device is generally denoted by 52.

Figure 3:
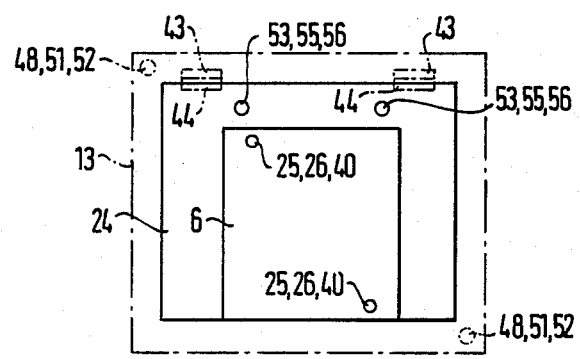
FIG. 3 is a top view of a carrier plate with a printed circuit board placed on top of it.

Near the testing position 21 there is also a centering device, denoted generally by 53, which likewise comprises two cylindrical centering pins 55, each displaceable axially and vertically by means of a piston-cylinder unit 54, whose downwardly pointing free ends are also conically sloped and serve to centre the carrier plate 24 at the testing position 21. In their release position, the centering pins 55 are above the carrier plate 24 (shown by a broken line in FIG. 4) and in their centering positions they are actively or passively moved into correspondingly shaped centering holes 56 in the carrier plate 24 (FIG. 5). For the purpose of saving space, the centering pins 55 are arranged at the back of the holding frame 11 and the carrier plate 24 so that in FIG. 4 only one centering pin 55 is visible. The arrangement of the centering devices and their stops 43 can be seen from above in FIG. 3.

The piston-cylinder units 47, 49 and 54, the associated guide rails 46 and centering pins 48 and 55 and their movable elements can, in an advantageous way, be centred and guided on a horizontal carrier plate 57, which is attached to the holding frame 11 and also carries the electronic testing device 12 which is centred and fixed opposite the carrier plate 52.

The function of the apparatus 1 will now be described.

Since the present apparatus 1 has replaceable adapters 13, it will first be assumed that a suitable adapter 13 is to be inserted. In order to do this, the adapter 13 is pushed into its guide 45 with the centering pins 48, 55 in their raised position and the guide rails 46 in their lower position. The latter is necessary as the heads, preferably spherical heads denoted by 61, of the test pins 27 must, both on pushing in and on withdrawal of the adapter 13, be located underneath contact elements, in the form of contact crowns 62, of the electronic testing device 12 which pass through the carrier plate 57. In the pushed in position, the adapter 13 is raised by means of a piston-cylinder unit 47 until the heads 61 contact the contact crowns 62, whereby the contact crowns 62 are partially pushed in by the pressure of a spring (not shown). In this position the adapter 13 is centred by pushing down the centering pins 48 and is fixed in a manner not shown.

To test a printed circuit board 6, it is placed on a carrier plate 24 at the insertion position 22 and at the same time is centred by centering pins 25 and holes 26 which form a centering device denoted generally by 40. The carrier plate is itself pre-positioned, with lateral play, by the pre-positioning edges 28. In this position the carrier plate 24 with the printed circuit board 6 is moved forward to the testing position 22 by the conveyor 20. It is possible to determine the conveyor path as part of the pre-positioning or to push and pre-position the carrier plate 24 against the stops 43. Afterwards the pressure rails 34 are elevated by operating the piston-cylinder unit 41, whereby the pressure member 38, by means of a central raised part, pushes substantially centrally against the second pressure plate 36, which acts through the four pressure bellows 37 uniformly on the first pressure plate 35 and thus on the pressure rails 34. The pressure rails 34 can be elevated because, between the middle and each of the outer of the three pressure rails 34, there is a gap into which the two central conveyor belts 32 dip passively. The outer pressure rail 34 moves past both outer conveyor belts 32. By means of the elevated pressure rails 34 the carrier plate 24 and the printed circuit board 6 are raised so far that the tips 64 of the test pins 7 contact the test points (not shown) of the printed circuit board 6 (FIG. 5). The elevation can go so far that the top of the printed circuit board 6 lies against the bottom of the adapter 13, whereby the test pins 27 and the contact crowns 62 are moved upwards. During or after the elevation, the centering of the carrier plate 24 is effected by pushing down the centering pins 55 into the centering holes 56 or by pushing the latter up on to centering pins 55, which in this case are not displaced. In this elevated position testing of the printed circuit board 6 takes place.

Following this, the printed circuit board 6 is lowered by tilting the pressure member 38 downwards until the carrier plate 24 lies on the conveyor belts 32, whereby the centering pins 55 are actively or passively withdrawn from the centering holes 56. For this purpose the stops 44 can act as strippers. The carrier plate 24 is then conveyed back by means of the conveyor 20 to the insertion position where the printed circuit board 6 can be removed.

The insertion and/or removal of the printed circuit board 6 can be done manually or by an automatic device.

Another important feature of the centering device 53 is that the centering pins 55 simultaneously pass through and hold the adapter 13 in correspondingly shaped centering holes 65. In this case it is advantageous to drill the centering holes 56 and 65 simultaneously in a bottom guide plate 66 of the adapter 13, which comprises several superimposed guide plates, so that a precise indexing of the adapter 13 relative to the carrier plate 24, and thus also to the printed circuit board 6, results.

Within the scope of the invention it is however also possible for the centering pins 55 only to centre the carrier plate 24, i.e. for them to pass through the adapter 13 with some play or to be arranged outside of the adapter 13. It is also possible to employ the centering pins 48 for centering the carier plate 24, for which all that is needed is a corresponding arrangement of centering holes in the carrier plate 24 and a corresponding stroke or control of the piston-cylinder unit 49. In the first exemplary embodiment described, the additional centering device 53 is provided for reasons of the best employment of space and of control techniques.

What is claimed is:

1. In an apparatus for testing a printed circuit board arranged on and/or off grid by means of an adapter which, during the testing, is arranged between contact elements of an electronic testing device and the printed circuit board at a testing position, the combination of a table-shaped receiving device for the printed circuit board with a holding frame arranged for holding the adapter and the testing device, a movable carrier plate for receiving the printed circuit board, a first centering device for centering the printed circuit board on the movable carrier plate, a conveyor for conveying the carrier plate between an insertion position and the testing position, and a second centering device for centering the carrier plate relative to the adapter provided near the testing position.

2. An apparatus according to claim 1, wherein the second centering device comprises at least one vertically displaceable first centering pin with a non-circular cross-section and a sloped point which can be inserted into and removed from a centering hole of corresponding cross-section in the carrier plate.

3. An apparatus according to claim 1, wherein the first centering device is formed by two pins fixed to the carrier plate, for insertion into associated centering holes of corresponding cross-section in a printed circuit board.

4. An apparatus according to claim 27, wherein the first centering pins have a cylindrical cross-section and have conical tips.

5. An apparatus according to claim 2, wherein the first centering pin is displaceable by a fluid driven piston-cylinder unit.

6. An apparatus according to claim 2, wherein the first centering pin also passes through a centering hole in the adapter and holds it.

7. An apparatus according to claim 1, wherein the first centering device is arranged at one of the back of the holding frame and the carrier plate.

8. An apparatus according to claim 1, and further including a guide in the form of a drawer into which the adapter is inserted.

9. An apparatus according to claim 8, wherein the guide is mounted to be raised and lowered and centered and fixed in its raised position.

10. An apparatus according to claim 9, wherein at least one centering pin is provided which can be pushed into and withdrawn from a centering hole of corresponding cross-section in the adapter.

11. An apparatus according to claim 10, wherein at least two centering pins are provided, said centering pins having a cylindrical cross-section and conical tips.

12. An apparatus according to claim 11, wherein the two centering pins are arranged diagonally in the holding frame.

13. An apparatus according to claim 1, wherein the adapter comprises at least two superimposed guide plates and wherein centering holes in the lowest guide plate of the adapter and in the carrier plate are prealigned.

14. An apparatus according to claim 1, wherein at least one piston-cylinder unit is provided on a fixed carrier plate and arranged to operate at least one centering pin for centering the movable carrier plate at the testing position.

15. An apparatus according to claim 1, wherein the conveyor comprises at least one belt.

16. An apparatus according to claim 1, wherein the conveyor comprises at least two parallel conveyor belts which run around wheels or rollers.

17. An apparatus according to claim 1, wherein at least one vertical displaceable pressure piece is arranged underneath the carrier plate near the testing position.

18. An apparatus according to claim 17, wherein the pressure piece is arranged to be pushed up by a pressure member which acts on a pressure plate located underneath the pressure piece, and wherein elastic members are arranged between the pressure plate and the pressure piece.

19. An apparatus according to claim 17, wherein the conveyor comprises at least one conveyor belt and wherein the pressure piece comprises a plurality of pressure rails extending along the length of the conveyor belt.

20. An apparatus according to claim 1, wherein on both sides of the conveyor at the insertion position there are provided pre-positioning elements between which the carrier plate can be received with some clearance.

21. An apparatus according to claim 1, wherein there is provided at least one stop for the movable carrier plate at the testing position.

22. An apparatus according to claim 21, wherein a stripper is provided near the testing position.

23. An apparatus according to claim 1, wherein the holding frame is arranged above the receiving device and is constructed to be swung upwards.

24. An apparatus according to claim 23, wherein the holding frame is constructed to be swivelled on an axis situated on one side of and parallel to the direction of movement of the conveyor.

25. An apparatus according to claim 23, wherein in its swung-down operational position, the holding frame is centered and fixed by centering and fixing elements on the side thereof facing away from its axis of swinging.

26. An apparatus according to claim 25, wherein said centering and fixing elements include at least one fluid centering and fixing pin.

27. An apparatus according to claim 1, wherein the second centering device comprises at least two vertically displaceable first centering pins having sloped points which can be inserted into and removed from a centering hole of corresponding cross-section in the carrier plate.

28. An apparatus according to claim 27, wherein the first centering pins are displaceable by at least one fluid-driven piston-cylinder unit.

29. An apparatus according to claim 27, wherein the first centering pins also pass through centering holes in the adapter and hold it.

30. An apparatus according to claim 27, wherein the first centering pins are arranged at one of the back of the holding frame and the carrier plate.

31. In an apparatus for testing a printed circuit board by means of an adapter which, during testing, is arranged between contact elements of an electronic testing device and the printed circuit board, the combination of a base structure including a holding frame arranged above the base structure for holding the adapter and the testing device, a carrier plate for receiving the printed circuit board, the carrier plate being movably mounted on the base structure between a testing position for testing the printed circuit board and an insertion position for inserting the printed circuit board, a first centering device for centering the printed circuit board on the carrier plate, a conveyor for conveying the carrier plate between the insertion position and the testing position, and a second centering device for centering both the carrier plate and the adapter when the carrier plate is in the testing position.

32. An apparatus according to claim 31, wherein the second centering device comprises at least one vertically displaceable first centering pin with a non-circular cross-section and a sloped point which can be inserted into and removed from centering holes of corresponding cross-section in the carrier plate and the adapter.

33. An apparatus according to claim 31 wherein the first centering device is formed by two pins fixed to the carrier plate, for insertion into associated centering holes of corresponding cross-section in the printed circuit board.

34. An apparatus according to claim 31, wherein the first centering device is arranged at one of the back of the holding frame and the carrier plate.

35. An apparatus according to claim 31, further including a guide in the form of a drawer into which the adapter is inserted.

36. An apparatus according to claim 35, wherein the guide is mounted to be raised and lowered and centered and fixed in its raised position.

37. An apparatus according to claim 31, wherein the adapter comprises at least two superimposed guide plates and wherein centering holes in the lowest guide plate of the adapter and in the carrier plate are prealigned.

38. An apparatus according to claim 31, wherein the conveyor comprises at least one belt run around wheels or rollers.

39. An apparatus according to claim 31, wherein at least one vertical displaceable pressure piece is arranged underneath the carrier plate near the testing position.

40. An apparatus according to claim 39, wherein the pressure piece is arranged to be pushed up by a pressure member which acts on a pressure plate located underneath the pressure piece, and wherein elastic members are arranged between the pressure plate and the pressure piece.

41. An apparatus according to claim 39, wherein the conveyor comprises at least one conveyor belt and wherein the pressure piece comprises a plurality of pressure rails extending along the length of the conveyor belt.

42. An apparatus according to claim 31, wherein on both sides of the conveyor at the insertion position there are provided pre-positioning elements between which the carrier plate can be received with some clearance.

43. An apparatus according to claim 31, wherein the holding frame is constructed to be swung upwards.

44. An apparatus according to claim 43, wherein in its swung-down operational position, the holding frame is centered and fixed by centering and fixing elements on the side thereof facing away from its axis of swinging.

* * * * *